(12) United States Patent
Kropp et al.

(10) Patent No.: US 6,573,328 B2
(45) Date of Patent: Jun. 3, 2003

(54) LOW TEMPERATURE, FAST CURING SILICONE COMPOSITIONS

(75) Inventors: Philip L. Kropp, Newington, CT (US); Lester D. Bennington, East Hartford, CT (US); Robert P. Cross, Rocky Hlll, CT (US); Bahram Issari, Rocky Hill, CT (US)

(73) Assignee: Loctite Corporation, Rocky Hill, CT (US)

( * ) Notice: Subject to any disclaimer, the term of this patent is extended or adjusted under 35 U.S.C. 154(b) by 0 days.

(21) Appl. No.: 09/753,837

(22) Filed: Jan. 3, 2001

(65) Prior Publication Data

US 2002/0142174 A1 Oct. 3, 2002

(51) Int. Cl.[7] .......................... C08L 83/05; C08L 83/07
(52) U.S. Cl. ........................ 524/588; 528/12; 528/15; 528/19; 528/24; 528/25; 528/29; 528/31; 528/32; 524/430
(58) Field of Search ............................ 528/12, 15, 19, 528/24, 25, 29, 31, 32; 524/430, 588; 525/478

(56) References Cited

U.S. PATENT DOCUMENTS

| | | |
|---|---|---|
| 3,159,601 A | 12/1964 | Ashby |
| 3,159,662 A | 12/1964 | Ashby |
| 3,188,299 A | 6/1965 | Chalk |
| 3,188,300 A | 6/1965 | Chalk |
| 3,192,181 A | 6/1965 | Moore |
| 3,220,970 A | 11/1965 | Strandbaden et al. |
| 3,344,111 A | 9/1967 | Chalk |
| 3,383,356 A | 5/1968 | Nielson |
| 3,445,420 A | 5/1969 | Kookootsedes et al. |
| 3,453,234 A | 7/1969 | Kookootsedes et al. |
| 3,461,185 A | 8/1969 | Brown |
| 3,516,946 A | 6/1970 | Modic |
| 3,532,649 A | 10/1970 | Smith et al. |
| 3,723,567 A | 3/1973 | Mink et al. |
| 3,814,730 A | 6/1974 | Karstedt |
| 3,882,083 A | 5/1975 | Berger et al. |
| 3,890,359 A | 6/1975 | Chandra |
| 3,933,880 A | 1/1976 | Bergstrom et al. |
| 3,989,666 A | 11/1976 | Niemi |
| 3,989,667 A | 11/1976 | Lee et al. |
| 4,043,977 A | 8/1977 | deMontigny et al. |
| 4,061,609 A | 12/1977 | Bobear |
| 4,256,870 A | 3/1981 | Eckberg |
| 4,262,107 A | 4/1981 | Eckberg |
| 4,287,094 A | 9/1981 | Panster et al. |
| 4,336,364 A | 6/1982 | Maxson ................... 528/15 |
| 4,337,332 A | 6/1982 | Melancon et al. ............ 528/15 |
| 4,347,346 A | 8/1982 | Eckberg |
| 4,444,944 A | 4/1984 | Matsushita .................. 524/786 |
| 4,465,818 A | 8/1984 | Shirahata et al. .............. 528/12 |
| 4,476,166 A | 10/1984 | Eckberg ...................... 427/387 |
| 4,533,575 A | 8/1985 | Melancon |
| 4,562,096 A | 12/1985 | Lo et al. .................. 427/208.8 |
| 4,587,137 A | 5/1986 | Eckberg ...................... 427/54.1 |
| 4,595,739 A | 6/1986 | Cavezzan .................... 528/15 |
| 4,600,484 A | 7/1986 | Drahnak ................ 204/157.74 |
| 4,609,574 A | 9/1986 | Keryk et al. |
| 4,774,111 A | 9/1988 | Lo .............................. 427/387 |
| 4,783,552 A | 11/1988 | Lo et al. ..................... 560/198 |
| 4,961,963 A | 10/1990 | Peters |
| 5,008,307 A | 4/1991 | Inomata |
| 5,082,735 A | 1/1992 | Revis et al. .................. 428/412 |
| 5,132,442 A | 7/1992 | Sumpter et al. ............ 556/136 |
| 5,132,885 A | 7/1992 | Hocheim et al. ........... 362/217 |
| 5,270,425 A | 12/1993 | Vanwert et al. |
| 5,270,457 A | 12/1993 | LaBella et al. .............. 552/557 |
| 5,312,885 A | 5/1994 | Takago et al. |
| 5,321,058 A | 6/1994 | Fuchigami et al. ......... 523/211 |
| 5,349,240 A | 9/1994 | Narita et al. ................. 257/791 |
| 5,352,731 A | 10/1994 | Nakano et al. ............. 524/786 |
| 5,371,163 A | * 12/1994 | Wilson |
| 5,391,588 A | 2/1995 | Sakamoto et al. ............. 522/99 |
| 5,442,026 A | 8/1995 | Crivello et al. ................ 528/15 |
| 5,516,558 A | 5/1996 | O'Brien ...................... 427/387 |
| 5,552,506 A | 9/1996 | Ebbrecht et al. |
| 5,629,399 A | 5/1997 | Juen et al. |
| 5,650,453 A | 7/1997 | Eckberg et al. ................ 522/31 |
| 5,665,471 A | 9/1997 | Kosal et al. ................. 428/378 |
| 5,672,660 A | 9/1997 | Medsker et al. ............. 525/101 |
| 5,773,561 A | * 6/1998 | Sachdev et al. |
| 5,808,127 A | 9/1998 | Nakagawa et al. ......... 556/479 |
| 5,866,666 A | 2/1999 | Herzig et al. .................. 528/28 |
| 5,936,028 A | 8/1999 | Medsker et al. ............. 524/506 |
| 6,077,611 A | * 6/2000 | Griswold et al. |

FOREIGN PATENT DOCUMENTS

| | | |
|---|---|---|
| CA | 2236391 | * 11/1998 |
| EP | 0 875 536 A2 | 4/1998 ........... C08L/83/04 |

OTHER PUBLICATIONS

Freeman, Silicones, The Plastics Institute, (1962), Table 2.2.*

* cited by examiner

*Primary Examiner*—Robert Dawson
*Assistant Examiner*—Kuo-Liang Peng
(74) *Attorney, Agent, or Firm*—Hoffman & Baron, LLP

(57) ABSTRACT

Heat-curable silicone compositions employing a reactive silicone, a silicone hydride crosslinker and a catalyst system which includes a rhodium-based catalyst, a stabilizing system are disclosed. A combination of rhodium and platinum-based catalysts are employed as well. The compositions are low temperature curing and are capable of providing low coefficient of thermal expansion compositions. A stabilizer system which includes in combination a peroxide and an acetylenic compound is also disclosed.

31 Claims, 2 Drawing Sheets

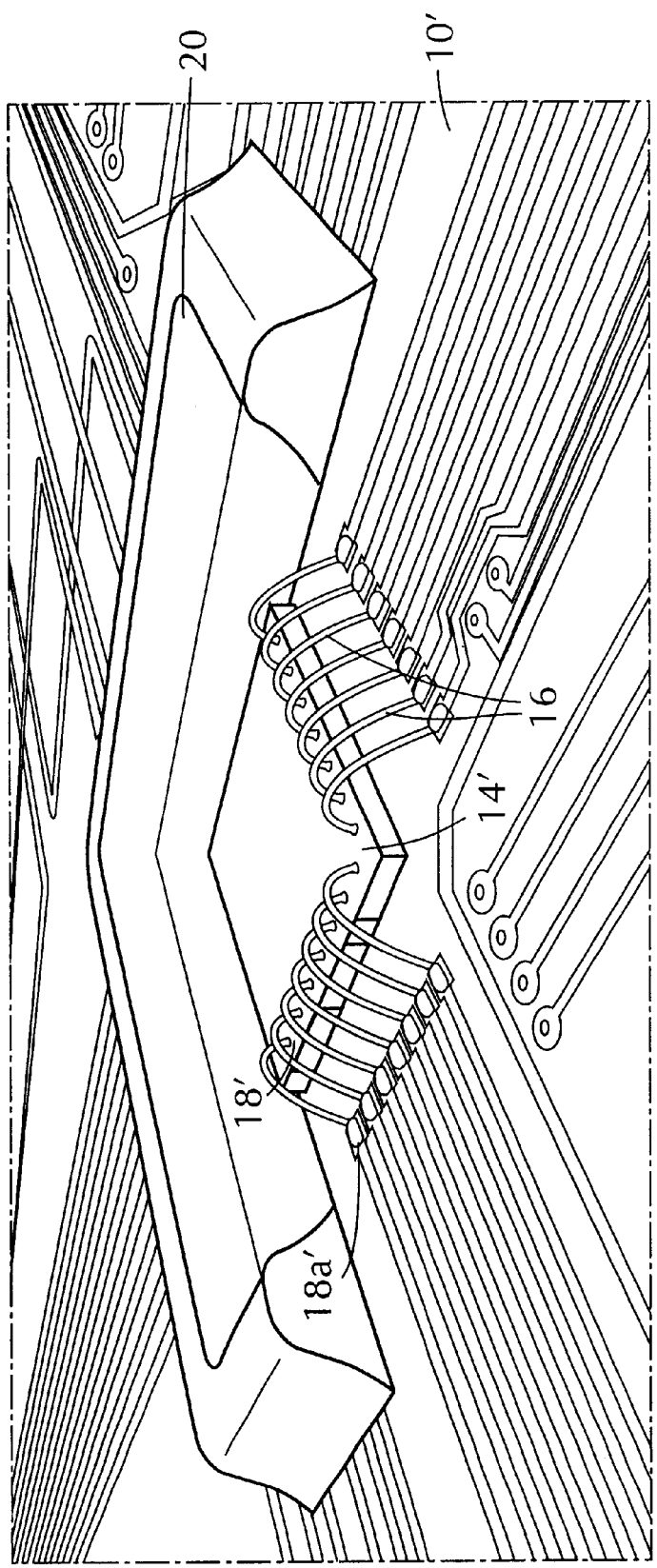

LOW TEMPERATURE, FAST CURING SILICONE COMPOSITIONS

FIELD OF THE INVENTION

The present invention relates to heat curable silicone compositions. More particularly, the present invention relates to low temperature, fast curing silicone compositions which include a rhodium catalyst.

BACKGROUND OF RELATED TECHNOLOGY

Silicone compositions are known to cure through a variety of mechanisms. For example, moisture cure, photocure and heat cure mechanisms are commonly used. In many applications, such as in the electronics industry, the use of heat cured mechanisms has limitations due to the heat sensitivity of the electronic components. For example, in electronic sealing applications, such as the sealing of electronic module boxes containing electronic components, the use of high temperature sealants to seal the module can deleteriously affect the electronic components. For such applications, moisture curing or photocuring compositions have been found to be more appropriate. Moisture curing compositions, however, are slower to reach full cure than other mechanisms. Photocure compositions often do not have sufficient cure-through-volume (CTV) and are therefore combined with moisture curing mechanisms to ensure full cure.

Additionally, advances in the electronic industry have made thermal management an increasingly important consideration, particularly with respect to packaging issues. For instance, heat build-up in electronic products tends to reduce reliability, slow performance and reduce power-handling capabilities. There is, therefore, a desire generally to reduce power consumption of electronic components, while increasing their number on semi-conductor chips which are reduced in size. Also, chip-on-board technology, where semi-conductor chips are mounted directly to printed circuit boards, creates further demands on thermal management because of the more efficient use of the surface area, creating increased chip density.

Numerous heat curable silicone compositions are disclosed in the patent literature. Many of these compositions disclose cure temperatures which are either too high for use in electronic applications, or disclose relatively low cure temperatures (e.g. about 100° C.) which require long cure times, which are often undesirable from a manufacturing standpoint. Moreover, such existing patent documents fail to appreciate the balancing of cure speed with stability and shelf-life of the compositions. Additionally, although various fillers are known, low temperature curing compositions have not been recognized to demonstrate controlled flow properties and viscosity, as well as low coefficients of thermal expansion, all of which are important to many electronic applications.

U.S. Pat. No. 4,444,944 to Matsushia, discloses an example of a heat-curable silicone composition which cures at relatively high temperatures. This patent discloses a heat curable, thermally conductive silicone composition having a crosslinkable polyorganosiloxane, a polyorganohydrogensiloxane crosslinking agent, an alumina powder having an average particle size in the range of $2.0\mu$ to $10\mu$ and an oil absorption of $\geq 15$ mL/g, and a platinum catalyst. These compositions can be cured by heating under ambient conditions at temperatures of about 250° to 450° C. Other platinum-group catalysts such as rhodium, iridium, ruthenium, and osmium are disclosed as useful.

U.S. Pat. No. 5,312,885 to Takago, et al., discloses curable organosiloxane compositions which contain a vinylsilyl-terminated perfluoropolyalkylene or perfluoropolyalkylene polyether compound as the reactive resin and employ specific rhodium catalysts for cure. The use of the rhodium catalysts is reported to impart greater storage stability without viscosity increases as compared to platinum-based catalysts. These compositions are directed toward stable compositions which do not use inhibitors. These compositions are disclosed as being curable when heated at temperatures from 70° to 150° C., though preferably at temperatures greater than 110° C.

U.S. Pat. No. 5,008,307 to Inomata, discloses relatively low temperature curing compositions which require long cure times. Cure temperatures of 100° C. for one hour and 80° C. for four hours are disclosed. This patent discloses thermally conductive silicone compositions which include an organopolysiloxane capable of reaction with an organohydrogenpolysiloxane having at least two SiH bonds, two types of aluminum powders which are a mixture of different sized spherical shaped particles, and a platinum catalyst.

Platinum and rhodium catalysts are commonly recited in prior patent documents directed toward heat curing silicone compositions. Generally, such prior patent documents often disclose them in a list of useful catalysts, along with others from the platinum group of the periodic table.

U.S. Pat. No. 5,552,506 to Ebbrecht et al., discloses the production of acrylic-modified organopolysiloxanes using rhodium catalysts. The resulting reactive compounds are disclosed as being useful as radiation curable lacquers or coating compositions, or as additives in such systems. These compounds are also disclosed as being thermally curable with the addition of peroxides.

U.S. Pat. No. 5,629,399 to Juen et al., discloses room temperature curing organosiloxane compositions which have an alkenyl-containing polyorganosiloxane, an organohydrogensiloxane, a platinum catalyst, a methylvinylcyclosiloxane and an acetylenic alcohol. The platinum catalyst is generally used in amounts of 5 to 250 parts by weight of platinum metal per million parts of the combined weights of the other components. The methylvinylcyclosiloxane component is disclosed as effecting the working time of the composition and the demold time, i.e. the time between when the composition is mixed and poured into a mold and the time when the resulting elastomer can be removed from the mold without permanent deformation. The acetylenic alcohol is used in amounts of 0.002 to 0.11% by weight. This component is also disclosed as effecting the working time and the demold time of the resulting composition. Reinforcing fillers such as finally divided silica and non-reinforcing fillers such as quartz alumna, mica and calcium carbonate are also disclosed as being useful in this composition. These compositions are designed for and disclosed as being room temperature curing compositions, with longer working time and shorter demolding time.

U.S. Pat. No. 5,270,457 to Vanwert, et al. discloses one part curable compositions having a curable polyorganosiloxane containing at least two alkenyl radicals per molecule, an organohydrogensiloxane crosslinker having at least two silicone bonded hydrogen atoms per molecule, a hydrosilation catalyst chosen from the platinum-group of the periodic table, and an adhesion promoting composition consisting of essentially of an epoxy-substituted silane and a cure inhibitor, such as cyclic methylvinylsiloxane, and an acetylenic alcohol containing at least six carbon atoms. These compositions are disclosed as curing at temperatures below 100° C.

Various applications in the electronic industry, including the sealing of electronic parts (such as underfill, glob top and dam and fill applications in microelectronic assemblies), potting of electronic parts, conformal coating applications, thermal and electrical conductive applications, as well as adhesive applications, would all benefit from silicone compositions which have the ability to rapidly cure, without exposure to high heat. Currently, among the fastest curing silicone compositions are those which use heat curing mechanisms, requiring cure temperatures too high for many electronic applications. Moreover, many electronic applications require silicone compositions which have the capability to not merely skin-over or partially cure, but fully cure in rapid fashion. Such rapid cure through volume ("CTV") is currently best achieved by using high temperature curing silicone compositions.

Conventional high temperature silicone compositions additionally have the disadvantages associated with high energy consumption, inefficient manufacturing processes and the higher costs associated therewith. Thus, there is a need for a rapid, low temperature curing silicone composition, which has a commercially acceptable shelf-life and which overcomes the disadvantages with conventional heat curing silicone compositions.

SUMMARY OF THE INVENTION

The present invention provides rapid, curing silicone compositions, capable of curing in a commercially acceptable time frame at temperatures lower than have been used in the past. These compositions can be used in a variety of applications, for example, in the electronics industry (such as in underfill, glob top and dam and fill applications in circuit board assembly), sealing applications, such as the sealing of electronic modules, potting applications, conformal coatings, thermal and electrical conductive applications, as well as adhesive applications, are among those for which the inventive compositions are useful.

In one aspect of the present invention, there is provided a heat-curable silicone composition which includes:
(a) a reactive silicone having at least two unsaturated functional groups;
(b) a silicone crosslinker having at least two reactive silicon hydride functional groups;
(c) a catalyst system including a rhodium catalyst; and
(d) a stabilizingly effective amount of an inhibitor system including a peroxide and an acetylenic compound.

The rhodium-based catalyst system of the present invention has been found to reduce the cure temperature of the inventive silicone compositions, as compared to traditional catalysts used with heat cure silicone compositions such as those based on platinum. Moreover, it has further been discovered that the use of rhodium catalysts in combination with platinum catalysts gives a more rapid cure, at a lower temperature, than using platinum alone and further improves the cure-through-volume of the cured reactive product.

Thus, in another aspect of the present invention there is provided a heat-curable silicone composition which includes:
(a) a reactive silicone having at least two unsaturated functional groups;
(b) a silicone crosslinker having at least two silicon hydride functional groups; and
(c) a catalyst system including in combination a rhodium and platinum catalyst.

The present invention further includes articles of manufacture, such as chip-on-board electronic devices, which include the inventive silicone compositions as encapsulants for the electronic components. Thus, in another aspect of the invention there is provided an encapsulating composition for use on semi-conductors, which includes:
(a) a reactive silicone having at least two unsaturated functional groups;
(b) a silicone crosslinker having at least two silicon hydride functional groups;
(c) a catalytically effective amount of a catalyst system including a rhodium-based catalyst or a combination of a rhodium-based catalyst and a platinum-based catalyst;
(d) optionally a stabilizingly effective amount of an inhibitor system which includes a peroxide, an acetylenic compound and combinations thereof; and
(e) optionally a flow modification agent which includes a dense metal oxide material, such as alumina, desirably in a generally spherical shape.

In another aspect of the present invention, there is provided a method of preparing heat-curable silicone compositions which have rapid curing and high cure-through-volume, which method includes the step of combining in admixture, a composition which includes:
(a) a reactive silicone having at least two unsaturated functional groups;
(b) a silicone crosslinker having at least two silicon hydride functional groups; and
(c) a catalyst system including in combination a rhodium and platinum catalyst.

In yet another aspect of the present invention there is included a heat curable silicone which in addition to the aforementioned reactive silicone and silicone crosslinker components, further includes in combination a peroxide and an acetylenic compound as a stabilizing or inhibitor system. Further, the inventive compositions also include flow modification agents which serve to enhance or otherwise control the flowability and/or viscosity of the final composition. The flow modification agents also serve to lower the coefficient of thermal expansion of the total composition and may also provide conductivity.

The present invention further includes a method of providing a low temperature-curing, rapid seal on a fixture such as an electronic part, the steps of which include administering to a surface of a fixture compositions of the present invention set forth therein, and permitting said compositions to cure

BRIEF DESCRIPTION OF THE DRAWINGS

FIG. 2 is a perspective view of a chip-on-board electronic device showing the components encapsulated with the inventive silicone composition in a "dam and fill" application.

DETAILED DESCRIPTION OF THE INVENTION

Figure 1:
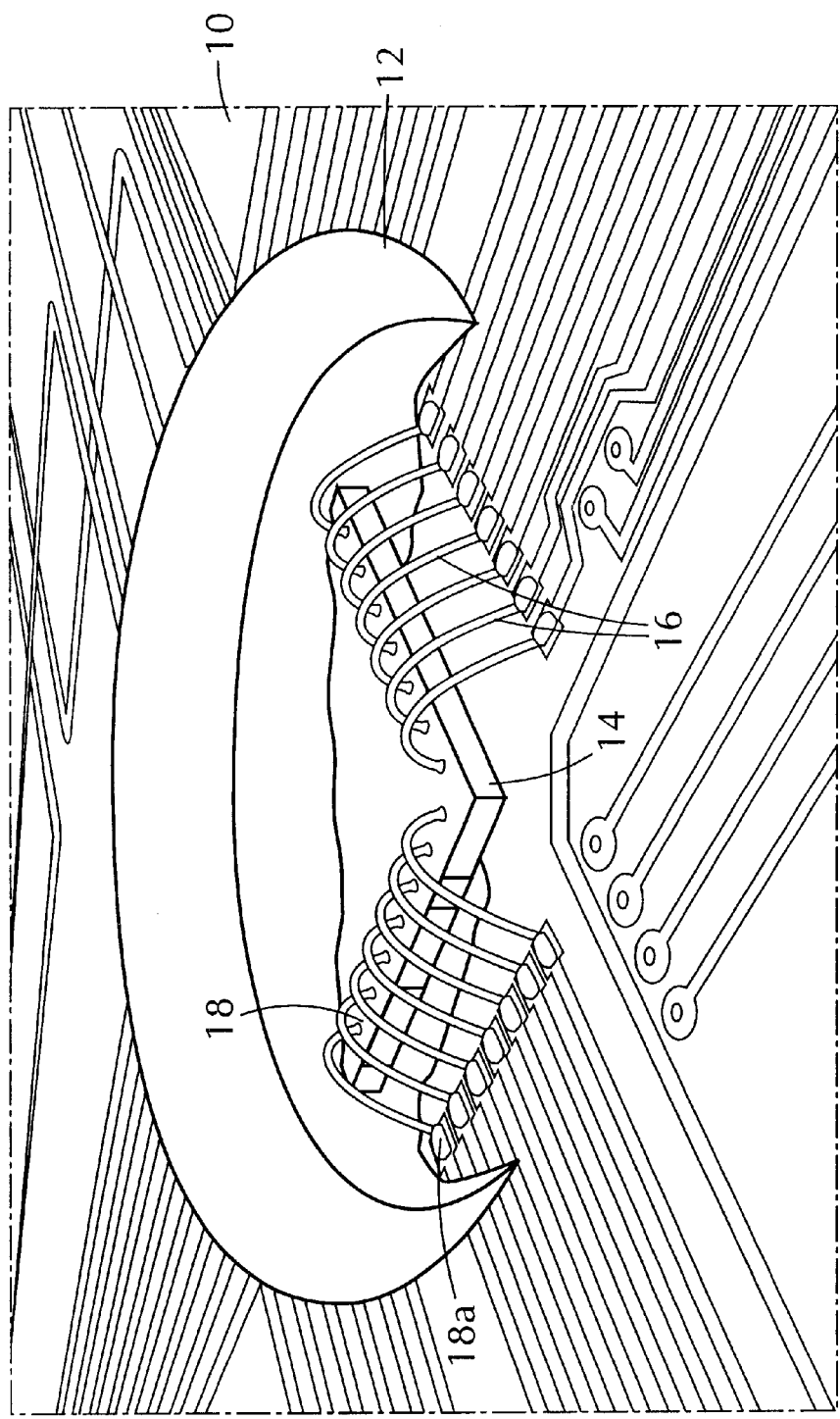
FIG. 1 is a perspective view of a chip-on-board electronic device showing the components encapsulated with the inventive silicone composition in a "glob top" application.

The reactive silicones in the present invention have at least two unsaturated functional groups to permit cross-linking of the composition. While the unsaturated group are desirably vinyl, other unsaturated groups may be employed. Useful reactive silicones may be generally represented by the following formula:

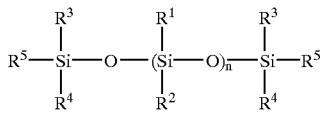

where $R^1$, $R^2$, $R^3$, $R^4$ and $R^5$ may be the same or different and may be hydrogen, alkyl, alkenyl, aryl, alkoxy, alkenyloxy, aryloxy, (meth)acryl or (meth)acryloxy provided that at least two of $R^1$, $R^2$, $R^3$, $R^4$ and $R^5$ have up to 12 carbon atoms ($C_{1-12}$) and include an unsaturated group; and n is an integer between about 100 and 1,200.

Desirably, the reactive silicone is a vinyl terminated polydimethylsiloxane, which may be represented by the following formula:

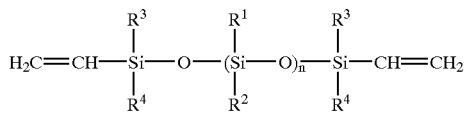

where $R^1$, $R^2$, $R^3$ and $R^4$ may be selected from alkyl, alkoxy, alkenyloxy, aryloxy, aryl, methacryl, methacryloxy and combinations thereof and n is between 100 and 1,200.

The reactive silicone is generally present in amounts sufficient to achieve the structural integrity required of the specific application chosen. In general, the reactive silicone may be present in amounts of about 15% to about 90%, and desirably about 20% to about 50% by weight of the total composition.

The reactive organopolysiloxanes of the present invention may optionally contain one or more hydrolyzable groups, in addition to the two unsaturated groups. In such cases, the silicone composition can then be made to cure using a mechanism other than heat. For example, moisture curing groups can be placed on the reactive silicone to impart moisture cure properties. Such hydrolyzable groups include amino, oxime, hydroxyl, alkoxy, aroloxy, alkaroloxy, aralkoxy and the like.

As a second component of the heat-curable silicone compositions of the present invention, there is included a silicone having at least two reactive silicon hydride functional groups. This component functions as a cross-linker for the reactive silicon. In the presence of the hydrosylization catalyst, the silicon-bonded hydrogen atoms in the cross-linking component undergo an addition reaction, which is referred to as hydrosilation with the silicon-bonded alkenyl or unsaturated groups in the reactive silicone component. This results in cross-linking and curing of the compositions. Since the reactive silicone component contains at least two unsaturated functional groups, the silicone cross-linking component should also contain at least two silicon-bonded hydrogen atoms to achieve the final cross-linked structure in the cured product. The silicon-bonded organic groups present in the silicone cross-linking component may be selected from the same group of substituted and unsubstituted monovalent hydrocarbon radicals as set forth above for the reactive silicone component, with the exception that the organic groups in the silicone cross-linker should be substantially free of ethylenic or acetylenic unsaturation. The silicone cross-linker may have a molecular structure that can be straight chained, branched straight chained, cyclic or networked.

The silicone cross-linking component may be selected from a wide variety of compounds, that desirably conforms to the formula below:

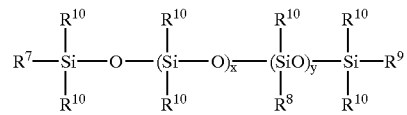

wherein at least two of $R^7$, $R^8$ and $R^9$ are H; otherwise $R^7$, $R^8$ and $R^9$ can be the same or different and can be a substituted or unsubstituted hydrocarbon radical from $C_{1-20}$ such hydrocarbon radicals including those as previously defined for formula I above; thus the SiH group may be terminal, pendent or both; $R^{10}$ can also be a substituted or unsubstituted hydrocarbon radical from $C_{1-20}$ such hydrocarbon radicals including those as previously defined for $R^7$, $R^8$ and $R^9$, and desirably is an alkyl group such as methyl; x is an integer from 10 to 1,000; and y is an integer from 1 to 20. Desirably R groups which are not H are methyl. The silicon hydride crosslinker should be present in amounts sufficient to achieve the desired amount of crosslinking and desirably in amounts of about 1 to about 10% by weight of the composition.

The third component of the inventive compositions includes a rhodium catalyst, which is effective for catalyzing the addition reaction between the silicon-bonded hydrogen atoms in the silicon crosslinker and the unsaturated groups in the reactive silicone. Useful rhodium catalysts include, but are not limited to, rhodium hydrocarbon complexes, such as tris(tributylsulfide) rhodium trichloride, (acetylacetonato)di-carbonylrhodium, tri(triphenylphosphine) rhodium chloride having the formula $(Ph_3P)_3RhCl$, rhodium acetate dimer having the formula $[(CH_3COO)_2Rh]_2$, and rhodium acetylacetonate having the formula $Rh(acac)_2$ in which acac is the acetylacetonato group forming a ring structure with the rhodium atom.

For instance, a rhodium- or platinum-containing transition metal complex may be used and chosen from a variety of organometallic materials or metallocenes. Those materials of particular interest herein may be represented by metallocenes within structure II:

II

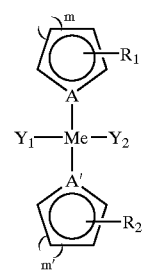

where $R_1$ and $R_2$ may be the same or different and may occur at least once and up to as many four times on each ring in the event of a five-membered ring and up to as many as five times on each ring in the event of a six-membered ring;

$R_1$ and $R_2$ may be selected from H; any straight- or branched-chain alkyl constituent having from 1 to about 8 carbon atoms, such as $CH_3$, $CH_2CH_3$, $CH_2CH_2CH_3$, $CH(CH_3)_2$, $C(CH_3)_3$ or the like; acetyl; vinyl; allyl; hydroxyl; carboxyl; $—(CH_2)_n—OH$, where n may be an integer in the range of 1 to about 8; $—(CH_2)_n—COOR_3$, where n may be an integer in the range of 1 to about 8 and $R_3$ may be any straight- or branched-chain alkyl constituent having from 1 to about 8 carbon atoms; H; Li; or Na; $—(CH_2)_n—OR_4$, wherein n may be an integer in the range of 1 to about 8 and $R_4$ may be any straight- or branched-chain alkyl constituent having from 1 to about 8 carbon atoms; or —$(CH_2)_n N^-(CH_3)_3$ $X^-$, where n may be an integer in the range of 1 to about 8 and X may be $Cl^-$, $Br^-$, $I^-$, $ClO_4^-$ or $BF_4^-$;

$Y_1$ and $Y_2$ may not be present at all, but when at least one is present they may be the same or different and may be selected from H, $Cl^-$, $Br^-$, $I^-$, cyano, methoxy, acetyl, hydroxy, nitro, trialkylamines, triaryamines, trialkylphosphines, triphenylamine, tosyl and the like; A and A' may be the same or different and may be C or N; m and m' may be the same or different and may be 1 or 2; and $M_e$ is Rh, and Pt.

Of course, depending on valence state, the element represented by $M_e$ may have additional ligands —$Y_1$ and $Y_2$—associated therewith beyond the carboxylic ligands depicted above.

Alternatively, metallocene structure II may be modified to include materials such as those within structure III below:

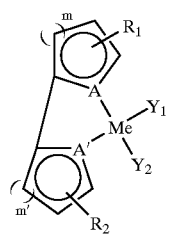

III where $R_1$, $R_2$, $Y_1$, $Y_2$, A, A', m, m' and $M_e$ are as defined above.

A particularly desirable example of such a material is where $R_1$ and $R_2$ are each H; $Y_1$ and $Y_2$ are each Cl; A and A' are each N; m and m' are each 2 and $M_e$ is Rh.

Within metallocene structure II, well-suited metallocene materials may be chosen from within metallocene structure IV:

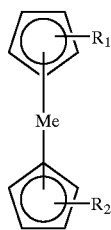

IV where $R_1$, $R_2$ and $M_e$ are as defined above.

Other used rhodium complexes are those disclosed in U.S. Pat. No. 3,890,359, the subject matter of which is incorporated herein by reference. For example, such complexes include $RhCl_3(EtSCH_2SiMe_3)_3$, $RhCl_3(n\text{-}BuSCH_2SiMe_3)_3$, $RhCl_3(PhSCH_2SiMe_3)_3$ and $RhCl_3[(Me_3SiCH_2)_2S]_3$, wherein Me, Et, Bu and Ph represent methyl, ethyl, butyl and phenyl radicals respectively.

The rhodium catalysts should be used in an amount effective to induce curing at an appropriate temperature, which is lower than that which is ordinarily required with non-rhodium heat cure catalysts. Desirably, the catalyst is present in amounts of about 0.0001% to about 1.0% by weight, and more desirably about 0.0002% to about 0.001% and even more desirably in amounts of about 0.0005% to about 0.003% by weight of the total composition.

The compositions of the present invention provide for faster curing at low temperatures, e.g., at temperatures of about 100° C. or less. Desirably, the compositions of the present invention can be formulated to fully cure at temperatures of about 60° to about 100° C., in time periods of about 2 to about 30 minutes. For example, tack-free cure can be obtained in about 6–10 minutes at about 75° C. to about 100° C. In particular, the catalyst system, which most desirably employs a combination of rhodium and platinum, provides a means of achieving faster, low temperature cure, while simultaneously achieving a commercially acceptable shelf-life. Surprisingly, this catalyst combination avails itself of the best properties of each catalyst, yet without the disadvantages of the individual catalysts when used alone. Enhanced surface cure and cure-through can be achieved using a lower total amount of catalyst. Moreover, at low temperatures, such as about 100° C., better adhesion is achieved than compositions which use just platinum or platinum-based catalysts. These advantages, as well as others, are obtained, while also providing a more stable formulation than rhodium alone. In addition, improved cure through volume is observed when such combination is used.

Useful platinum catalysts include platinum or platinum-containing complexes such as the platinum hydrocarbon complexes described in U.S. Pat. Nos. 3,159,601 and 3,159,662; the platinum alcoholate catalysts described in U.S. Pat. No. 3,220,970, the platinum complexes described in U.S. Pat. No. 3,814,730 and the platinum chloride-olefin complexes described in U.S. Pat. No. 3,516,946. Each of these patents relating to platinum or platinum-containing catalysts are hereby expressly incorporated herein by reference.

The relative amounts of rhodium-based catalyst to platinum-based catalyst may range from about 1:100 to about 10:1.

In addition to the aforementioned catalysts, other catalysts may be used in combination with the rhodium and rhodium/platinum catalyst combinations. For example, complexes of ruthenium, palladium, oznium and arridium are also contemplated.

Other useful metallocenes which may be included in combination with the inventive catalyst system include ferrocenes (i.e., where $M_e$ is Fe), such as ferrocene, vinyl ferrocenes, ferrocene derivatives, such as butyl ferrocenes or diarylphosphino metal-complexed ferrocenes [e.g. 1,1-bis (diphenyiphosphino) ferrocene-palladium dichloride], titanocenes (i.e., where $M_e$ is Ti), such as bis(eta 5-2,4-cyclopentadien-1-yl)-bis-[2,6-difluoro-3-(1H-pyrrol-1-yl) phenyl] titanium which is available commercially from Ciba Specialty Chemicals, Tarrytown, N.Y. under the tradename "IRGACURE" 784DC, and combinations thereof A particularly desirable metallocene is ferrocene.

And bis-alkylmetallocenes, for instance, bis-alkylferrocenes (such as diferrocenyl ethane, propanes, butanes and the like) are also desirable for use herein.

Other materials well-suited for use herein include $M_e[CW_3\text{—}CO\text{—}CH\text{=}C(O^-)\text{—}CW'_3]_2$, where $M_e$ is as defined above, and W and W' may be the same or different and may be selected from H, and halogens, such as F and Cl. Examples of such materials include platinum (II) acetylacetonate ("PtACAC"), cobalt (II) acetylacetonate ("Co(II) ACAC"), cobalt (III) acetylacetonate ("Co(III)ACAC"), nickel (II) acetylacetonate ("NiACAC"), iron (II) acetylacetonate ("Fe(II)ACAC"), iron (III) acetylacetonate ("Fe(III) ACAC"), chromium (II) acetylacetonate ("Cr(II)ACAC"), chromium (III) acetylacetonate ("Cr(III)ACAC"), manganese (II) acetylacetonate ("Mn(II)ACAC"), manganese (III) acetylacetonate ("Mn(III)ACAC") and copper (II) acetylacetonate ("CuACAC").

It has also been discovered that the shelf stability of the rapid, low temperature compositions of the present invention can be significantly enhanced by incorporating an inhibitor system, which includes a combination of an acetylenic compound, such as an acetylenic alcohol and a peroxide. Quite surprisingly, peroxides, which are known to initiate free radical curing mechanisms present in heating curing silicone compositions, have been found to increase the shelf stability of the inventive compositions, alone or in combination with an acetylinic compound.

A desirable inhibitor system includes the combination of an acetylene compound such as an acetylenic alcohol or ester, such as octynol, and a peroxide. The amount of acetylenic compound useful in the inhibitor system ranges from about 0.01% to about 2.0% by weight of the total composition, and desirably about 0.1% to about 1.0% by weight of the total composition. Useful acetylenic compounds for inclusion in the inhibitor system include an alpha acetylenic alcohol selected from the group consisting of octynol, 1-octyn-3-ol, 3-butyn-2-ol, 2-phenyl-3-butynol, 3,5-dimethyl-1-hexyn-3-ol, propargyl alcohol and combinations thereof.

Useful peroxides for inclusion in the inhibitor system include cumene hydroperoxide (CHP), tertiary butyl hydroperoxide (TBH) and the like. Other peroxides may of course be employed. The amount of peroxide compounds used in the inhibitor system ranges from about 0.001% to about 1% by weight of the total composition, and desirably about 0.01% to about 0.1% by weight of the total composition.

As mentioned above, flow modifying agents may be incorporated into the inventive compositions to influence flowability and viscosity of the composition. The present invention provides low temperature heating-curing silicone compositions having controlled flowability. Desirably, the flow modifiers are spherically shaped or having shapes approximating a sphere to increase flow properties, but other shapes may be chosen as well, to suit application needs. Flowability and viscosity control are particularly of concern in electronic applications. Flow modifying agents useful include relatively dense metal oxides, such as alumina, zinc oxide and the like. As previously mentioned, desirably these agents are spherical in shape and have an average particle size of about 1 to about $10\mu$.

Another aspect of the invention relates to heat curing silicone compositions which have relatively low coefficients of thermal expansion (CTE). This aspect of the invention also provides silicone compositions which, notwithstanding very high amounts of flow modifying agents, e.g., 50 to 90% by weight, exhibit excellent flowability in the uncured state, have a commercially acceptable shelf-life and relatively stable viscosity over time. The particular flow modifying agents are chosen to achieve flowable materials having low CTE. In particular, dense metal oxides such as alumina have been found to be extremely effective in achieving such flowable compositions having low CTE properties. Other heavy metal oxides such as zinc oxide and the like, may also be useful, but are generally less effective at producing flowable compositions when used in amounts sufficient to reduce CTE due to their dendritic or sharp irregular surface geometries. Alumina particles are desirably spherical in shape, the combination of the material's density and shape enhancing the flowability properties of the silicone composition. As previously mentioned, the average particle size of spherical alumina found to be particularly useful is in the range of about $1\mu$ to $10\mu$. Smaller particle sizes of the flow modifier may additionally be incorporated to help maintain the larger particles in suspension. Desirably, spherically shaped alumina particles of about $1\mu$ or less are incorporated as suspension stabilizers for the larger diameter alumina particles.

The reactive silicone component when cured tends to expand significantly more than the metal oxide flow modifiers. Incorporating the flow modifiers in the aforementioned amounts provides cured compositions which are less influenced by the forces of thermal expansion. Minimizing thermal expansion is particularly important when the compositions are used as encapsulants for electronic parts. Less thermal expansion of the cured composition results in less stress on electronic parts adjacent thereto.

The compositions of the present invention have been found to be particularly useful as encapsulants for chip-on-board devices. FIG. 1 shows a perspective view of a chip-on-board device. In this figure, substrate 10, also commonly referred to as a circuit board, is shown having a central area 12 for attaching a semi-conductor chip 14, also commonly referred to as a die. Electrical wires or leads 16 connect the circuit board to the semi-conductor chip 14 at connections 18 and 18a. The chip and wire connections are then encased or encapsulated with the inventive silicone composition, which is then subjected to relatively low heat to cure. The cured composition serves to protect the electronic components. This configuration is often referred to as a "glob top" application.

FIG. 2 is also a perspective view of a chip-on-board electronic device, with a configuration commonly referred to as a "dam and fill" application. The semi-conductor chip 14' is located on circuit board 10', which in turn are connected to each other by wire leads 16' at locations 18' and 18a'. A reservoir or dam area having walls 20 is shown about semi-conductor chip 14'. This dam area provides a volume in which the inventive composition can be applied or filled.

In addition to the aforementioned semiconductor encapsulant applications, other electronic applications, such as the filling of gaps or the wicking of the silicone composition into voids are also contemplated.

Compositions of the present invention may also include one or more amino-containing silane compounds which act as adhesion promoters. These amino-containing silane compounds are present in amounts of about 0.1 percent by weight of the composition to about 5.0 percent by weight of the composition. Desirably, these compounds are present in amounts of about 0.74 percent by weight of the composition to about 1.4 percent by weight of the composition. Amino-containing silane compounds which are useful in the present invention include, but are not limited to, silane compounds containing amino-alkyl groups, such as gamma-ureidopropyltrimethoxy silane, 3-aminopropyl trimethoxysilane, N,N'-bis (3-trimethoxy silylpropyl) urea, gamma-aminopropyltrimethoxysilane, N-(2-aminoethyl)-3-aminopropyltriethoxysilane, N-(2-aminoethyl)-3-aminopropyltrimethoxysilane, trimethoxysilylpropyldiethylene triamine, tertiary alkyl carbamate silane, and aminoethyl-3-aminopropyl-methyl-dimethylsilane. Other desirable amino-containing silane compounds include silane compounds containing amino-cycloaliphatic groups such as methyl tris (cyclohexylamino)silane and silane compounds containing amino-aromatic groups such as methyl tris-(N-methylbenzamido)silane. Adhesion promoters may be present in amounts of up to about 5%, and desirably up to about 2% by weight.

Examples of useful commercially available adhesion promoters include octyl trimethoxysilane (commercially available from Witco Corporation, Greenwich, Conn. under the trade designation A-137), glycidyl trimethoxysilane (commercially available from Witco under the trade designation A-187), methacryloxypropyl trimethoxysilane (commercially available from Witco under the trade designation of A-174), vinyl trimethoxysilane, tetraethoxysilane and its partial condensation products, and combinations thereof The inventive compositions may also contain other additives so long as they do not interfere with the curing mechanisms or intended use. For example, conventional additives such as fillers, promoters, pigments, moisture scavengers, inhibitors and the like may be included. Fillers such as fumed silica or quartz are contemplated, as are moisture scavengers such as methyltrimethoxysilane and vinyl trimethoxysilane.

Examples of fillers include zirconium silicate, hydroxides such as hydroxides of calcium, aluminum, magnesium, iron and the like. Other fillers such as diatomaceous earth, carbonates such as sodium, potassium, calcium and magnesium carbonates may be employed. Calcium clay, graphite and synthetic fibers may also be incorporated. Mixtures of fillers are contemplated.

The following examples illustrate various aspects of the invention. Percents are based on the weight of the total composition, unless otherwise stated.

EXAMPLES

Heat curable silicone compositions were prepared as set forth in Table I, below. A premix of the vinyl-terminated PDMS and the catalysts were prepared separately and added to the additional components, with mixing. Composition A is a control composition and employs only a platinum catalyst. Compositions B–G are all representative of the invention. Compositions B–D are representative of the low temperature, fast curing compositions of the present invention which employ either a rhodium catalyst alone (B) or a combination of rhodium and platinum catalysts (C–D). In addition, Compositions A–D each employ a combination of peroxide and an acetylenic compound as a stabilizing system.

Compositions E–G demonstrate the aspect of the invention which employs a rhodium catalyst in combination with a significant amount of a flow modifying agent to provide a flowable, low temperature curing and low CTE composition.

TABLE I

| Component | Compositions (% by weight) | | | | | | |
| --- | --- | --- | --- | --- | --- | --- | --- |
| | A | B | C | D | E | F | G |
| Vinyl terminated[1] PDMS (35,000–45,000 cps) | 81.52 | 81.57 | 81.56 | 81.55 | 25.42 | 25.71 | 25.71 |
| Hydride crosslinker | 5.03 | 5.03 | 5.03 | 5.03 | 1.78 | 1.76 | 1.76 |
| Adhesion promoter | 1.06 | 1.06 | 1.06 | 1.06 | 0.62 | 0.62 | 0.62 |
| Filler | 3.12 | 3.12 | 3.12 | 3.12 | — | — | — |
| Flow modifying agent | — | — | — | — | 72.18[4] | 71.91[5] | 71.91 |
| Plasticizer | 9.00 | 9.00 | 9.00 | 9.00 | — | — | — |
| UV inspection dye | 0.02 | 0.02 | 0.02 | 0.02 | — | — | — |
| Rhodium catalyst[2] | — | 0.0071 | 0.0021 | 0.0035 | 0.00096 | 0.00095 | 0.0019 |
| Platinum catalyst[6] | 0.07 | — | 0.02 | 0.04 | — | — | — |
| Peroxide | 0.04 | 0.04 | 0.04 | 0.04 | — | — | — |
| Acetylenic compound[3] | 0.14 | 0.14 | 0.14 | 0.14 | — | — | — |

[1] Vinyl terminated polydimethylsiloxane (combination of 150–250 cps and 35,000–45,000 cps material)
[2] Rh(I) complex: (acetylacetonato)dicarbonylrhodium(I) 99%, Alfar Aesar 39.76% Rh.
[3] Octynol
[4] 0.48% spherical alumina having an average size of <1 $\mu$, and 71.7% of spherical alumina having an average size of about 10 $\mu$
[5] 0.48% spherical alumina having an average size of <1 $\mu$, and 71.43% of spherical alumina having an average size of about 10 $\mu$
[6] 2% platinum metal in a complex dissolved in methylvinylcyclics.

A variety of properties were tested for Compositions A–D. These are set forth in Table II, below. In particular, Compositions C and D exhibited as good or better cure-through time using lower total amount of catalyst as compared to Composition A (control). Additionally, DSC measurements indicated a maximum exotherm peak for Compositions C and D at 1.09 and 1.0 minutes respectively, as compared to Composition A (control) which exhibited the maximum peak at 1.53 minutes. These measurements are also indicative of faster cure times of the inventive composition.

It should be noted that each of the Compositions A–D were prepared in the same manner and are substantially identical but for the catalysts.

It is generally well recognized that platinum as a catalyst is known to effectuate fast curing in heat-curing silicone compositions, but such compositions suffer from stability problems. By combining platinum with rhodium, the same or faster cure times can be achieved without the stability problems of platinum alone.

Inventive Compositions B, C and D were also measured for tensile strength. As indicated in the table, Compositions B–D had significant improvement in tensile strength after 1 hour at 100° C. cure, as compared to Composition A (control).

From these test results, it can be seen that inventive Compositions B–D have distinct advantages in cure speed, cure-through time and tensile speed when cured at 100° C., as compared to substantially the same composition containing only a platinum catalyst.

Compositions E–G were each tested for suspension stability of the flow modifying agent, flowability of the uncured composition, as well as viscosity stability. These formulations were found to have acceptable suspension stability and good flowability. Upon storage at room temperature for 4 days, the viscosity remained substantially the same, i.e. 43,590 cps after 1 day and 43,220 cps after 4 days.

TABLE II

| Property | Compositions | | | |
|---|---|---|---|---|
| | A | B | C | D |
| Gel @ 23° C. | 12 Days | 20 Days | 16 Days | 12 Days |
| ppm Platinum* | 18 ppm Pt | 0 ppm Pt | 5 ppm Pt | 9 ppm Pt |
| ppm Rhodium** | 0 ppm Rh | 28 ppm Rh | 8 ppm Rh | 14 ppm Rh |
| 100° C. Tack Free*** | 5 min | 8 min | 8 min | 6 min |
| 100° C. cured Through*** | 10 min | 12 min | 12 min | 8 min |
| Viscosity @ $7s^{-1}$ After −7° C. for 10 Days | 42,000 cps | 67,000 cps | 43,000 cps | 51,000 cps |
| Viscosity @ $7s^{-1}$ After −7° C. for 20 Days | 44,000 cps | 72,000 cps | 45,000 cps | 52,000 ops |
| Viscosity @ $7s^{-1}$ After −7° C. for 30 Days | 42,000 cps | 65,000 cps | 44,000 cps | 52,000 ops |
| STM-2116 DSC T-3102 = Reference 90% Conversion @ 105° C. (conformal coating parameters: RDP. 1008) | [1]5.12 min. [2]1.53 min. peak exotherm | Not measurable by method | [1]8.58 min. [2]1.00 min. peak exotherm | [1]4.45 min. [2]1.09 min. peak exotherm |
| Lapshear Adhesion, TS-021 aluminum, No induced gap, ½" overlap, Cured 1 hr 100° C., tensile mode (average of 5 specimens) | 174 psi ± 52 | 223 psi ± 21 | 263 psi ± 52 | 269 psi ± 30 |

*based on 2.5% Pt in solvent
**based on 99.9% purity of acetylacetonatodicarbonylrodium(1)
***100° C. open platen, 3" × ⅛" diameter bead. TS-021 aluminum lapshear.
[1]Time when 90% of the reaction has occurred.
[2]Time at which the peak exotherm has occurred.

The following example demonstrates the effect of the combination of a peroxide and an acetylenic compound as a stabilizer system. The following heat curable silicone composition was prepared using only a rhodium catalyst. Composition H represents a control with no stabilizer system. Compositions I & J contain only a peroxide or an acetylenic compound but not the combination. Composition K represents the inventive combination of a peroxide and an acetylenic compound as a stabilizer system.

TABLE III

| | Compositions (% by weight) | | | |
|---|---|---|---|---|
| Component | H | I | J | K |
| Vinyl terminated PDMS (8000–12000 cP) | 15.40 | 15.39 | 15.36 | 15.34 |
| Vinyl MQ resin in vinyl terminated PDMS (8500 cP) | 5.00 | 5.00 | 4.99 | 4.98 |
| Hyride crosslinker | 2.52 | 2.52 | 2.52 | 2.52 |
| Adhesion promoter | 1.15 | 1.15 | 1.15 | 1.17 |
| Filler | 75.88 | 75.81 | 75.68 | 75.63 |
| Rhodium catalyst[1] | 0.05 | 0.05 | 0.05 | 0.05 |
| Peroxide | — | 0.08 | — | 0.08 |
| Acetylenic compound | — | — | 0.25 | 0.23 |
| Initial viscosity[2] | 130,000 cP | 126,000 cP | 133,200 cP | 119,200 cP |

[1]Tris(dibutylsulfide) rhodium trichloride 20% in toluene
[2]Viscosity at a shear rate of 5 $sec^{-1}$ as measured with a Haake rheometer at 25° C.

The composition with no stabilizers (H) gelled in 14 days. Composition I shows the addition of only cumene hydroperoxide to an otherwise identical formulation to Composition H. After 21 days its viscosity increased 51%. Composition J shows the addition of only the acetylenic compound octynol to an otherwise identical formulation to Composition H. After 11 days its viscosity doubled. Inventive Composition K, which contained a combination of cumene hydroperoxide and octynol, only increased 33% in viscosity in 21 days. These results clearly demonstrate the stabilizing effect of a peroxide and an acetylenic compound when used in a curable silicone composition employing a rhodium-based catalyst.

The examples set forth above serve to illustrate various portions of the present invention, but are in no way intended to limit the spirit and scope thereof, which are defined by the following claims.

What is claimed is:

1. A heat-curable silicone composition comprising:
    (a) a reactive silicone having at least two unsaturated functional groups;
    (b) a silicone crosslinker having at least two reactive silicon hydride functional groups;
    (c) a catalyst system comprising a rhodium-based catalyst; and
    (d) a stabilizing effective amount of a stabilizing system comprising a peroxide and an acetylenic compound, wherein the acetylenic compound is an alpha acetylenic alcohol selected from the group consisting of octynol, 1-octyn-3-ol, 3-butyn-2-ol, 2-phenyl-3-butynol, 3,5-dimethyl-1-hexyn-3-ol, propargyl alcohol and combinations thereof.

2. The heat-curable silicone composition of claim 1, wherein the catalyst system is present in amounts of about 0.0002% to about 1.0% by weight of the total composition.

3. The heat-curable silicone composition of claim 1, wherein said catalyst system is present in amounts of about 0.0005% to about 0.003% by weight of the total composition.

4. The heat-curable silicone composition of claim 1 further comprising a flow modifying agent.

5. The heat-curable silicone composition of claim 4 wherein the flow modifying agent is a dense metal oxide having an average size of about 1 to about 10μ.

6. The heat-curable silicone composition of claim 5 further comprising a shaped dense metal oxide having an average size of less than about 1μ.

7. The heat-curable silicone composition of claim 4 wherein said flow modifying agent is thermally conductive.

8. A heat-curable silicone composition of claim 1, wherein said silicone of (b) has at least three silicone hydride functional groups.

9. A heat-curable silicone composition of claim 1, wherein said reactive silicone is represented by the structure:

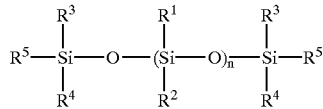

wherein $R^1$, $R^2$, $R^3$, $R^4$ and $R^5$ may be the same or different and are hydrogen, alkyl, alkenyl, aryl, alkoxy, alkenyloxy, aryloxy, (meth)acryl or methacryloxy provided that at least two of $R^1$, $R^2$, $R^3$, $R^4$ and $R^5$ have up to 12 carbon atoms ($C_{1-12}$) and include an unsaturated group; and n is an integer between about 100 and 1,200.

10. The heat-curable silicone composition of claim 1, wherein the unsaturated functional groups are selected from the group consisting of vinyl groups, (meth)acryl groups, allyl groups, and combinations thereof.

11. The heat-curable silicone composition of claim 1, wherein the reactive silicone comprises vinyl-terminated polydimethylsiloxane.

12. The heat-curable silicone composition of claim 1, wherein the reactive silicone has a Brookfield viscosity of about 150 to about 45,000 cps at room temperature.

13. The heat-curable silicone composition of claim 1, wherein the peroxide is selected from the group consisting of cumene hydroperoxide, tertiary butyl hydroperoxide, tertiary butyl perbenzoate, ditertiarybutyl peroxide, dicumyl peroxide and combinations thereof.

14. The heat-curable silicone composition of claim 1, further comprising a material selected from the group consisting of fillers, plasticizers, dyes, adhesion promoters, cross-linkers, thermal conductive materials, inhibitors and combinations thereof.

15. A heat curable silicone composition comprising:
    (a) a reactive silicone having at least two unsaturated functional groups;
    (b) a silicone crosslinker having at least two reactive silicone hydride functional groups;
    (c) a catalyst system comprising in combination a rhodium-based and platinum-based catalyst; and
    (d) an inhibitor system comprising an acetylenic compound, wherein the acetylenic compound is an alpha acetylenic alcohol selected from the group consisting of octynol, 1-octyn-3-ol, 3-butyn-2-ol, 2-phenyl-3-butynol, 3,5-dimethyl-1-hexyn-3-ol, propargyl alcohol and combinations thereof.

16. A heat curable silicone composition of claim 15, wherein said reactive silicone comprises structures of the following formula:

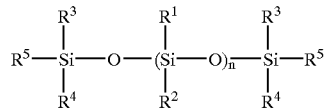

wherein $R^1$, $R^2$, $R^3$, $R^4$ and $R^5$ may be the same or different and are hydrogen, alkyl, alkenyl, aryl, alkoxy, alkenyloxy, aryloxy, (meth)acryl or methacryloxy provided that at least two of $R^1$, $R^2$, $R^3$, $R^4$ and $R^5$ have up to 12 carbon atoms ($C_{1-12}$) and include an unsaturated group; and n is an integer between about 100 and 1,200.

17. A heat curable silicone composition of claim 15, wherein said silicone of (b) has at least three reactive silicone hydride functional groups.

18. A heat curable silicone composition of claim 15, wherein said catalyst system is present in amounts of about 0.0001% to about 1.0% by weight of the total composition.

19. A heat curable silicone composition of claim 15, wherein said catalyst system includes the rhodium-based and platinum-based catalysts in relative amounts of about 1:100 to about 10:1.

20. A heat curable silicone composition of claim 15, wherein the inhibitor system further includes a peroxide.

21. A method of preparing a heat-curable silicone composition providing in admixture a composition comprising:
    (a) selecting a reactive silicone having at least two unsaturated functional groups;
    (b) selecting a silicone crosslinker having at least two reactive silicon hydride functional groups;

(c) selecting a catalyst system comprising a rhodium-based catalyst;

(d) selecting a stabilizing effective amount of an inhibitor system comprising a peroxide and an acetylenic compound, wherein the acetylenic compound is an alpha acetylenic alcohol selected from the group consisting of octynol, 1-octyn-3-ol, 3-butyn-2-ol, 2-phenyl-3-butynol, 3,5-dimethyl-1-hexyn-3-ol, propargyl alcohol and combinations thereof; and (e) combining the reactive silicone, the silicone crosslinker, the catalyst system and the inhibitor system into an admixture.

22. A method of preparing a heat-curable silicone composition comprising:

(a) selecting a reactive silicone having at least two unsaturated functional groups;

(b) selecting a silicone crosslinker having at least two reactive silicon hydride functional groups;

(c) selecting a catalyst system comprising a rhodium catalyst and a platinum-based catalyst;

(d) selecting a stabilizing effective amount of an inhibitor system comprising a peroxide and an acetylenic compound; and (e) combining the reactive silicone, the silicone crosslinker, the catalyst system and the inhibitor system into an admixture.

23. A heat curable silicone comprising the reaction product of:

(a) a reactive silicone having at least two unsaturated functional groups;

(b) a silicone crosslinker having at least two reactive silicon hydride functional groups;

(c) a catalyst system comprising a rhodium-based catalyst; and (d) a stabilizing effective amount of a stabilizing system comprising a peroxide and an acetylenic compound, wherein the peroxide is selected from the group consisting of cumene hydroperoxide, tertiary butyl hydroperoxide, tertiary butyl perbenzoate, ditertiarybutyl peroxide, dicumyl peroxide and combinations thereof.

24. A heat curable silicone comprising the reaction product of:

(a) a reactive silicone having at least two unsaturated functional groups;

(b) a silicone crosslinker having at least two reactive silicone hydride functional groups;

(c) a catalyst system comprising in combination a rhodium-based and platinum-based catalyst; and (d) a stabilizing effective amount of a stabilizing system comprising a peroxide and an acetylenic compound.

25. A heat-curable silicone composition comprising:

(a) a reactive silicone having at least two unsaturated functional groups;

(b) a silicone crosslinker having at least two reactive silicon hydride functional groups;

(c) a catalyst system comprising a rhodium-based catalyst;

(d) a stabilizing effective amount of a stabilizing system comprising a peroxide and an acetylenic compound; and (e) a dense metal oxide flow modifying agent having an average size of about 1 to about 10$\mu$.

26. A heat-curable silicone composition of claim 25 further comprising a dense metal oxide flow modifying agent having an average size of less than about 1$\mu$.

27. The heat-curable composition of claim 1, wherein the rhodium-based catalyst is selected from the group consisting of tris(tributylsulfide) rhodium trichloride; (acetylacetonato) di-carbonylrhodium; tri(triphenylphosphine) rhodium chloride having the formula $(Ph_3P)_3RhCl$; rhodium acetate dimer having the formula $[(CH_3COO)_2Rh]_2$; rhodium acetylacetonate having the formula $Rh(acac)_2$ in which acac is the acetylacetonato group forming a ring structure with the rhodium atom; $RhCl_3(EtSCH_2SiMe_3)_3$ in which Me, Et, Bu and Ph represent methyl, ethyl, butyl and phenyl radicals respectively; $RhCl_3(n-BuSCH_2SiMe_3)_3$ in which Me, Et, Bu and Ph represent methyl, ethyl, butyl and phenyl radicals respectively; $RhCl_3(PhSCH_2SiMe_3)_3$ in which Me, Et, Bu and Ph represent methyl, ethyl, butyl and phenyl radicals respectively; $RhCl_3[(Me_3SiCH_2)_2S]_3$ in which Me, Et, Bu and Ph represent methyl, ethyl, butyl and phenyl radicals respectively; rhodium-containing transition metal complex; and combinations thereof; wherein the rhodium-containing transition metal complex is selected from metallocenes of the following structures:

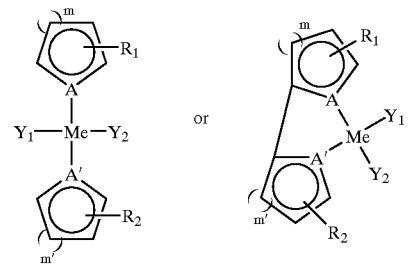

where $R_1$ and $R_2$ are selected from H; a straight- or branched-chain alkyl constituent having from 1 to about 8 carbon atoms; acetyl; vinyl; allyl; hydroxyl; carboxyl; —$(CH_2)_n$—OH, where n is an integer in the range of 1 to about 8; —$(CH_2)_n$—$COOR_3$, where n is an integer in the range of 1 to about 8 and $R_3$ is a straight- or branched-chain alkyl constituent having from 1 to about 8 carbon atoms; H; Li; or Na; —$(CH_2)_n$—$OR_4$, wherein n is an integer in the range of 1 to about 8 and $R_4$ is a straight- or branched-chain alkyl constituent having from 1 to about 8 carbon atoms; or —$(CH_2)_n$ $N^+(CH_3)_3X^-$, where n is an integer in the range of 1 to about 8 and X is $Cl^-$, $Br^-$, $I^-$, $ClO_4^-$ or $BF_4^-$;

$Y_1$ and $Y_2$, which may be the same or different or may not be present at all, are selected from H, $Cl^-$, $Br^-$, $I^-$, cyano, methoxy, acetyl, hydroxy, nitro, trialkylamines, triaryamines, trialkylphosphines, triphenylamine, tosyl;

A and A', which may be the same or different, are C or N;

m and m', which may be the same or different, are 1 or 2; and $M_e$ is Rh.

28. The heat-curable composition of claim 15, wherein the platinum-based catalyst is selected from the group consisting of platinum hydrocarbon complex, platinum alcoholate, platinum chloride-olefin complex, platinum-containing transition metal complex and combinations thereof; wherein the platinum-containing transition metal complex is selected from metallocenes of the following structures:

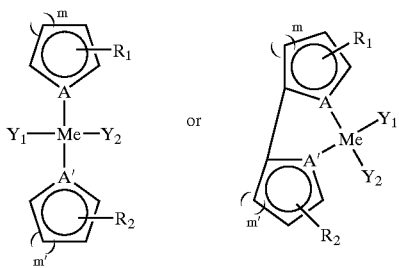

where

R$_1$ and R$_2$ are selected from H; a straight- or branched-chain alkyl constituent having from 1 to about 8 carbon atoms; acetyl; vinyl; allyl; hydroxyl; carboxyl; —(CH$_2$)$_n$—OH, where n is an integer in the range of 1 to about 8; —(CH$_2$)$_n$—COOR$_3$, where n is an integer in the range of 1 to about 8 and R$_3$ is a straight- or branched-chain alkyl constituent having from 1 to about 8 carbon atoms; H; Li; or Na; —(CH$_2$)$_n$—OR$_4$, wherein n is an integer in the range of 1 to about 8 and R$_4$ is a straight- or branched-chain alkyl constituent having from 1 to about 8 carbon atoms; or —(CH$_2$)$_n$N$^+$(CH$_3$)$_3$X$^-$, where n is an integer in the range of 1 to about 8 and X is Cl$^-$, Br$^-$, I$^-$, ClO$_4^-$ or BF$_4^-$;

Y$_1$ and Y$_2$, which may be the same or different or may not be present at all, are selected from H, Cl$^-$, Br$^-$, I$^-$, cyano, methoxy, acetyl, hydroxy, nitro, trialkylamines, triaryamines, trialkyiphosphines, triphenylamine, tosyl;

A and A', which may be the same or different, are C or N;

m and m', which may be the same or different, are 1 or 2; and

M$_e$ is Pt.

29. A heat curable silicone composition of claim 20, wherein the peroxide is selected from the group consisting of cumene hydroperoxide, tertiary butyl hydroperoxide, tertiary butyl perbenzoate, ditertiarybutyl peroxide, dicumyl peroxide and combinations thereof.

30. A method of preparing a heat-curable silicone composition comprising:
(a) selecting a reactive silicone having at least two unsaturated functional groups;
(b) selecting a silicone crosslinker having at least two reactive silicon hydride functional groups;
(c) selecting a catalyst system comprising a rhodium-based catalyst;
(d) selecting a stabilizing effective amount of a stabilizing system comprising a peroxide and an acetylenic compound;
(e) selecting a dense metal oxide flow modifying agent having an average size of about 1 to about 10μ; and
(f) combining the reactive silicone, the silicone crosslinker, the catalyst system, the inhibitor system and the flow modifying agent into an admixture.

31. A method of preparing a heat-curable silicone composition providing in admixture a composition comprising:
(a) selecting a reactive silicone having at least two unsaturated functional groups;
(b) selecting a silicone crosslinker having at least two reactive silicon hydride functional groups;
(c) selecting a catalyst system comprising a rhodium-based catalyst;
(d) selecting a stabilizing effective amount of an inhibitor system comprising a peroxide and an acetylenic compound, wherein the peroxide is selected from the group consisting of cumene hydroperoxide, tertiary butyl hydroperoxide, tertiary butyl perbenzoate, ditertiarybutyl peroxide, dicumyl peroxide and combinations thereof and
(e) combining the reactive silicone, the silicone crosslinker, the catalyst system and the inhibitor system into an admixture.

* * * * *

UNITED STATES PATENT AND TRADEMARK OFFICE
CERTIFICATE OF CORRECTION

PATENT NO.    : 6,573,328 B2
DATED         : June 3, 2003
INVENTOR(S)   : Kropp et al.

It is certified that error appears in the above-identified patent and that said Letters Patent is hereby corrected as shown below:

<u>Title page,</u>
Item [74], *Attorney, Agent, or Firm*, should read -- Hoffmann & Baron, LLP --.

<u>Column 15,</u>
Line 52, "silicone hydride" should read -- silicon hydride --.

<u>Column 16,</u>
Line 25, "silicone hydride" should read -- silicon hydride --.
Line 52, "silicone hydride" should read -- silicon hydride --.

<u>Column 17,</u>
Line 49, "silicone hydride" should read -- silicon hydride --.

Signed and Sealed this

Twenty-fifth Day of November, 2003

JAMES E. ROGAN
*Director of the United States Patent and Trademark Office*